United States Patent [19]

Poret

[11] Patent Number: 5,023,775
[45] Date of Patent: Jun. 11, 1991

[54] SOFTWARE PROGRAMMABLE LOGIC ARRAY UTILIZING "AND" AND "OR" GATES

[75] Inventor: Mark Poret, Phoenix, Ariz.

[73] Assignee: Intel Corporation, Santa Clara, Calif.

[21] Appl. No.: 598,794

[22] Filed: Oct. 15, 1990

Related U.S. Application Data

[63] Continuation of Ser. No. 388,304, Jul. 27, 1989, abandoned, which is a continuation of Ser. No. 88,992, Aug. 21, 1987, abandoned, which is a continuation of Ser. No. 702,046, Feb. 14, 1985, abandoned.

[51] Int. Cl.$^5$ .......................................... H03K 19/00
[52] U.S. Cl. .................................. 364/200; 364/244.9; 364/259.1; 307/465
[58] Field of Search ................... 340/825.83; 307/465; 364/200, 900, 716

[56] References Cited

U.S. PATENT DOCUMENTS

| | | | |
|---|---|---|---|
| 3,783,254 | 1/1974 | Eichelberger | 307/203 |
| 3,855,536 | 4/1972 | Neuner | 307/465 |
| 3,912,914 | 10/1975 | Moylan | 307/465 |
| 3,976,983 | 2/1975 | Moussle | 365/96 |
| 4,034,356 | 7/1977 | Howley et al. | 307/269 |
| 4,051,352 | 9/1977 | Eichelberger et al. | 364/716 |
| 4,068,305 | 1/1978 | Cutler | 364/200 |
| 4,293,783 | 10/1981 | Patil | 307/289 |
| 4,488,246 | 12/1984 | Brice | 364/900 |
| 4,609,986 | 9/1986 | Hartman | 364/200 |
| 4,617,479 | 10/1986 | Hartmann et al. | 364/900 |
| 4,642,487 | 2/1987 | Carter | 307/465 |
| 4,659,948 | 4/1987 | Sunter et al. | 364/716 |
| 4,791,602 | 12/1988 | Resnick | 364/900 |

FOREIGN PATENT DOCUMENTS

| | | | |
|---|---|---|---|
| 958884 | 5/1964 | United Kingdom . | |
| 1499964 | 2/1978 | United Kingdom . | |
| 2089160 | 6/1982 | United Kingdom | 364/716 |
| 2138188 | 10/1984 | United Kingdom . | |

OTHER PUBLICATIONS

*Logical Design of Digital Systems*, by Friedman, ©1975, pp. 160–221.
*Electronic Circuits: Discrete and Integrated*, by Donald L. Schilling, copyrighted 1979, pp. 518–573.
IBM Technical Disclosure Bulletin, vol. 21, No. 6, Nov. 1978, pp. 2474-2475, "Programmable Boolean Function Generator", by Sakaley.

*Primary Examiner*—Lawrence E. Anderson
*Attorney, Agent, or Firm*—Blakely, Sokoloff, Taylor & Zafman

[57] ABSTRACT

A software programmable logic array ("SPLA") is disclosed for creating a logic array which can be dynamically programmed to provide any combination of predetermined outputs from any combination of desired inputs. The foregoing is accomplished by providing a first plane of programmable bits for producing a plurality of AND terms which are input to a second plane of programmable bits for producing a plurality of OR terms, which are then input into a third plane of programmable bits for producing a plurality of outputs, each having a desired polarity.

7 Claims, 3 Drawing Sheets

SOFTWARE PROGRAMMABLE LOGIC ARRAY UTILIZING "AND" AND "OR" GATES

This is a continuation of Ser. No. 388,304, filed July 27, 1989, which is a continuation of 088,792, filed Aug. 21, 1987, which is a continuation of 702,046 filed Feb. 14, 1985, all now abandoned.

BACKGROUND OF THE INVENTION

Programmed logic arrays, often referred to as PLAs are well known circuits for producing a set of predetermined output signals, the values of which depend upon the values of the inputs to the PLA. In the prior art, ordinary logic gates, such as NAND gates and/or NOR gates, or other known logic arrays may be utilized to construct a PLA. Alternatively, in the prior art, read only memories (ROMS) are also utilized as PLAs. For example, each address within a ROM can be initialized to a desired value. In this manner, by placing appropriate signals on the address lines of a ROM, a particular location in the ROM is addressed and its contents can then be placed on the output lines of the ROM. Of course, once desired values are loaded into locations in the ROM, such values become fixed. Although programmable ROMs are available (PROMs), by their very nature, such PROMs cannot be changed during normal operation. That is, in order to reprogram a PROM, it is necessary to subject the PROM to an environment which is substantially different than that encountered during its normal operation. In particular, PROMs may be UV PROMs or EE PROMs for ultraviolet erasable or electronically erasable PROMs respectively. In order to reprogram UV PROMs, it is necessary to remove the device from its normal operating environment and place it into a device specially designed to program the PROM. Similarly, in order to reprogram an EE PROM, voltages much higher than those utilized in logic circuits during normal operation must be provided.

Thus, while PLAs are extremely useful devices for providing predetermined output signals in response to received input signals, they cannot be utilized in applications wherein the predetermined output signals must be dynamically changed notwithstanding that the same set of input signals are input to the PLA.

Of course, it is possible to build a PLA which provides all possible outputs. For example, if a PROM is utilized as a PLA then, if there are eleven outputs, all possible outputs can be provided in an array of $2^{10}$ locations. However, excepting in cases where it is necessary to use all or substantially all possible outputs, such an array would be extremely inefficient since most locations would never be accessed. Additionally, even with an array capable of producing all possible outputs, the output for a particular input would necessarily always be the same.

SUMMARY OF THE INVENTION

A software programmable logic array ("SPLA") is disclosed for creating a logic array which can be dynamically programmed to provide any combination of predetermined outputs from any combination of desired inputs. The foregoing is accomplished by providing a first plane of programmable bits for producing a plurality of AND terms which are input to a second plane of programmable bits for producing a plurality of OR terms, which are then input into a third plane of programmable bits for producing a plurality of outputs, each having a desired polarity.

To accomplish the foregoing, in addition to the desired inputs to the SPLA which produce the predetermined outputs, a second set of inputs are provided which are available only during initialization of the SPLA to program each programmable bit so that the predetermined outputs can be produced as desired. The second set of inputs are generated by placing desired addresses and data on an address/data bus, which addresses are decoded such that each programmable bit can be addressed and placed in a desired state by the data on the bus such that each programmable bit produces a desired predetermined output based upon a given input. In particular, in the AND plane, each programmable bit is programmed to output; a "0" regardless of its input; a "1" regardless of its input; whatever is input, that is, a "0" input yields a "0" output and a "1" input yields a "1" output; or the inverse of whatever is input. In the OR plane, each programmable bit is programmed to output; a "0" regardless of its input; or whatever is input, that is a "0" input yields a "0" output and a "1" input yields a "1" output. In the third, i.e. output plane, each programmable bit is programmed to output whatever is input or the inverse of whatever is input.

DETAILED DESCRIPTION OF THE INVENTION

A software programmable logic array ("SPLA") is disclosed for producing a plurality of predetermined outputs based upon the values of desired inputs, such that the output for a given input can be dynamically programmed without removing the SPLA from the circuit and environment in which it is being utilized. In the following description, numerous specific details are set forth such as specific word or term lengths, etc. to provide a thorough understanding of the present invention. However, it will be obvious to those skilled in the art that the present invention may be practiced without such specific details. In other instances, well known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Figure 1:
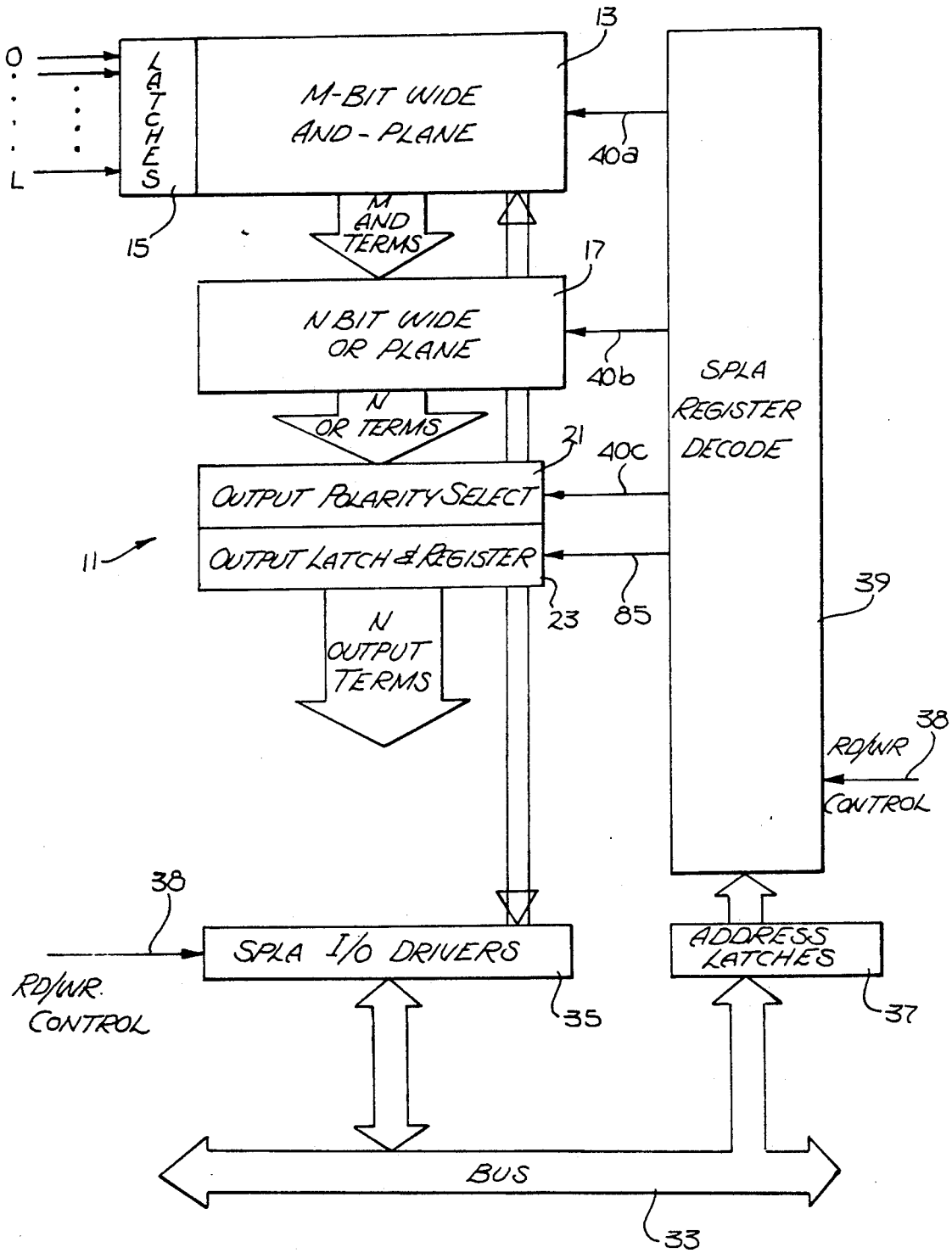
FIG. 1 is a block diagram showing the various elements of an SPLA as contemplated by the present invention.

Referring to FIG. 1, SPLA 11 comprises an M bit wide AND plane 13 into which inputs 0 through L are latched by latches 15. Of course, the latching of input 0 through L occurs based upon a predetermined clocking signal (not shown). The outputs from the AND plane are then input to an N-bit wide OR plane 17. In this connection, M and N refer to the number of AND terms and OR terms respectively in AND plane 13 and OR plane 17. M and N may be any number greater than or equal to 1. Of course, as a practical matter, M and N will usually range between 8 and 32 bits wide. It should be understood that the number of programmable bits within AND plane 13 is L*M and the number of programmable bits in OR plane 17 is M*N. The OR terms generated by OR plane 17 are then input to output polarity select plane 21 the output of which in turn is latched by output latch and register 23 which simply stores the SPLA output until such time as the output is needed or can be accepted by the circuit in which the SPLA is implemented.

Also shown in FIG. 1 are SPLA register decode circuitry 39, bus 33, SPLA I/O drives 35 and address latches 37, each of which will be described in conjunction with the description of the SPLA below. While such elements are necessary for the SPLA to function, they do not form part of the claimed invention.

Figure 2:
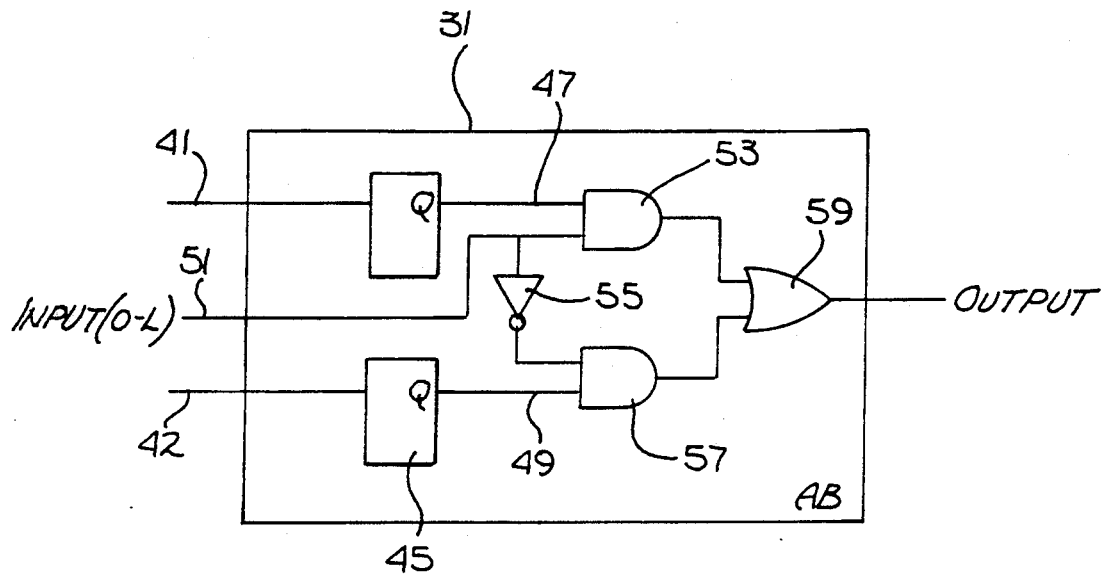
FIG. 2 is a logic level diagram showing a single programmable bit in an AND term.

Referring now to FIG. 2 the construction of a single programmable bit 31 within AND plane 13 will now be described. Functionally, programmable bit 31 is programmed to produce an output which is: the same as its input; the input inverted; a "0" regardless of the input; or a "1" regardless of the input. This function is accomplished by programming the bit prior to applying one of inputs 0-L to the programmable bit. In particular, the programmable bits in the AND plane are programmed by (referring to FIG. 1) placing an address and data on bus 33 wherein the address on the bus is the address of a particular AND term in which a programmable bit 31 is located and the data on the bus is a string of 0's and 1's depending upon whether a "0" or "1" is to be applied to a particular input select register, i.e. flip flop 43 or 45 within the programmable bit of the AND term being addressed. An address on bus 33, as determined by appropriate clocking signals (not shown) is latched by address latches 37. The latched address is then input to SPLA register decode circuit 39 which decodes the address and places appropriate signals on line 40a to allow the appropriate programmable bits in AND plane 13 to be programmed according to data placed on bus 33. In particular, after addressing the desired programmable bits, data is placed on bus 33 for setting the addressed programmable bits in a desired configuration. The data on bus 33 is then input to the addressed programmable bits in AND plane 13 by SPLA I/0 driver 35 and the addressed programmable bits are then reconfigured as desired. In a similar manner, programmable bits within OR plane 17 or output polarity select plane 21 can be addressed and reconfigured as desired.

Bus 33, SPLA I/O driver 35, address latches 37 and SPLA register decode circuit 39 may be implemented according to well known design criteria for such circuits, the details of which will not be set forth herein as such details are well within the skill of those skilled in the relevant art and are highly dependent upon the processor being used to generate the data and address signals. If desired, particular programmable bits within the SPLA can be read by addressing the desired bits through SPLA register decode circuit 39 and setting RD/WR control line 38 to instruct decoder 39 and driver 35 that a read operation is taking place in which case the outputs from addressed programmable bits are placed on bus 33 for subsequent processing.

For example, assume a particular programmable bit 31 is programmed by placing a "1" on line 41 input to flip flop 43 and a "1" on line 42 input to flip flop 45. In this manner, outputs 47 and 49 from flip flops 43 and 45 respectively will cause one input of AND gates 53 and 57 to be a "1." Now, if a "0" is placed on input line 51, the inputs to AND gate 53 will be a "1" and a "0" and, therefore, one input to OR gate 59 will be a "0." However, since the "0" input on line 51 will be inverted by inverter 55, both inputs to AND gate 57 will be "1" and, therefore, the other input to OR gate 59 will be "1" and, the output of programmable bit 31 will therefore be a "1." Similarly, if the input on line 51 is a "1" the two inputs to AND gate 53 will be "1" in which case one of the inputs to OR gate 59 will be "1" and its output will, therefore be a "1." Thus, in this configuration, the programmable bit 31 will output a "1" regardless of whether "0" or "1" is input.

If "0's" are input on lines 41 and 42 to flip flops 43 and 45 such that the outputs of the flip flops on lines 47 and 49 will be "0" then, regardless of the input on line 51, the outputs from AND gates 53 and 57 will always be "0," the inputs to OR gate 59 will also be "0" and the output of OR gate 59 will therefore be "0."

In a similar fashion, if programmable bit 31 is programmed such that a "1" is placed on line 41 and a "0" is placed on line 42, the output of AND gate 53 will always be the same as the input on line 51 and the output of AND gate 57 will always be "0." In this manner, the output from OR gate 59 will always be the same as the input on input line 51.

If the programmable bit 31 is programmed such that a "0" is placed on line 41 and a "1" is placed on line 42, then only the inverse of the input on line 51 (i.e. the output of inverter 55) will be input to OR gate 59, the other input always being a "0." In this manner, the output of the programmable bit will always be the inverse of the input on line 51. The following table summarizes the possible configurations and outputs of a particular programmable bit 31:

| Line 51 Input | Flip Flop 43 Q Output | Flip Flop 45 Q Output | OR Gate 59 Output |
| --- | --- | --- | --- |
| 0 | 0 | 0 | 0 |
| 0 | 0 | 1 | 1 |
| 0 | 1 | 0 | 0 |
| 0 | 1 | 1 | 1 |
| 1 | 0 | 0 | 0 |
| 1 | 0 | 1 | 0 |
| 1 | 1 | 0 | 1 |
| 1 | 1 | 1 | 1 |

Figure 3:
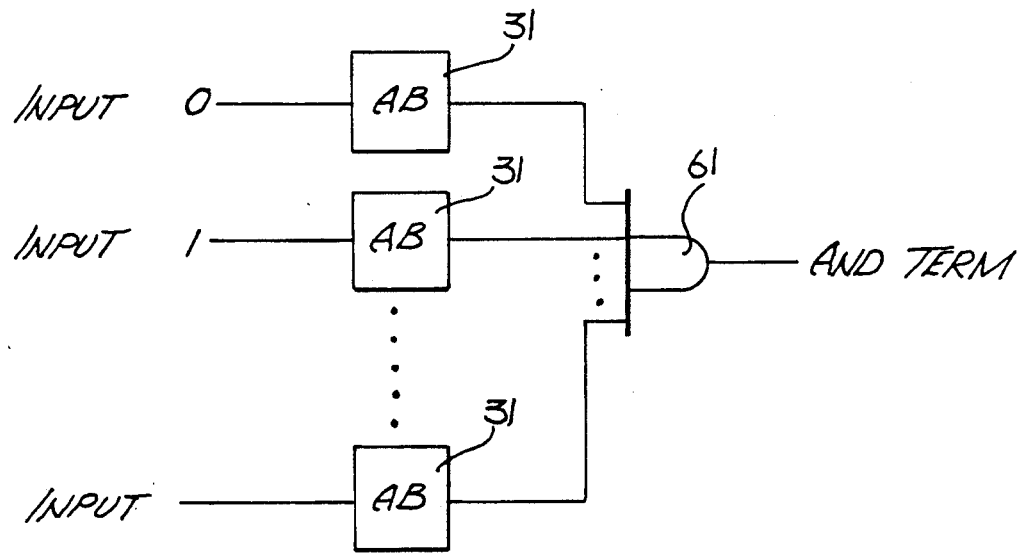
FIG. 3 is a block diagram showing a plurality of programmable bits as shown in FIG. 2 combined to form a single AND term.

Of course, each of the inputs 0 through L is input to a different programmable bit for each AND term. Referring now to FIG. 3, by ANDing together the set of programmable bits for each of inputs 0 through L, a single AND term is produced as an output of AND gate 61. By applying inputs 0 through L to a second set of programmable bits 31 whose outputs are in turn ANDed together, a second AND term is produced. In a similar manner, third, fourth fifth, etc. through M AND terms can also be provided. Thus, in an M-bit wide AND plane, M AND terms are output.

Figure 4:
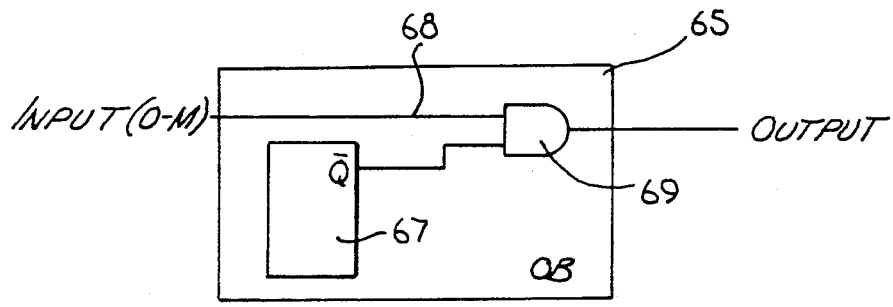
FIG. 4 is a logic level diagram showing a single programmable bit of an OR term.

Referring now to FIG. 4, a single programmable bit 65 of OR plane 17 is shown. Of course, for each level of the OR plane, there is a single programmable bit 65 for each of 0 through M inputs which comprise the 0 through M AND terms from AND plane 13. Each programmable bit 65 comprises a flip flop 67 whose $\bar{Q}$ output is one input to an AND gate 69. The other input to AND gate 69 is one of the inputs 0 through M. By programming each programmable bit 65 such that the $\bar{Q}$ output of flip flop 67 is either a "1" or a "0" the output of each programmable bit 65 will be either the input on line 68, if the $\bar{Q}$ output is "1," or "0" if the $\bar{Q}$ output is "0."

Figure 5:
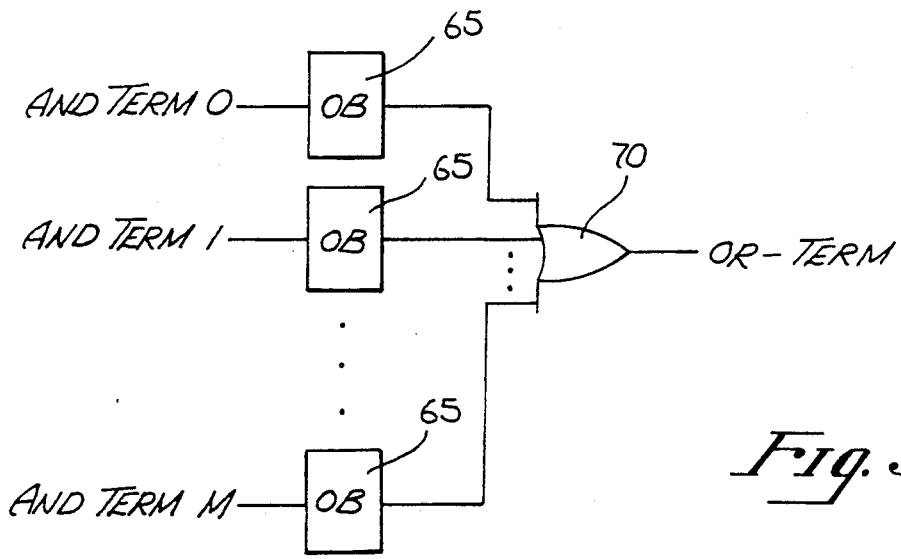
FIG. 5 is a diagram showing a plurality of programmable bits as shown in FIG. 4 combined to produce a single OR term.

Referring now to FIG. 5, as was the case with the AND terms, by ORing together the outputs of the programmable bits 65 for each of the AND terms 0 through M through OR gate 70, a single OR term is output. By applying AND terms 0 through M to a second set of programmable bits 65 whose outputs are in turn ORed together, a second OR term is produced. In a similar manner, third, fourth and fifth, etc. through N OR terms can also be provided. Thus, in an N-bit wide OR plane N OR terms are output.

Figure 6:
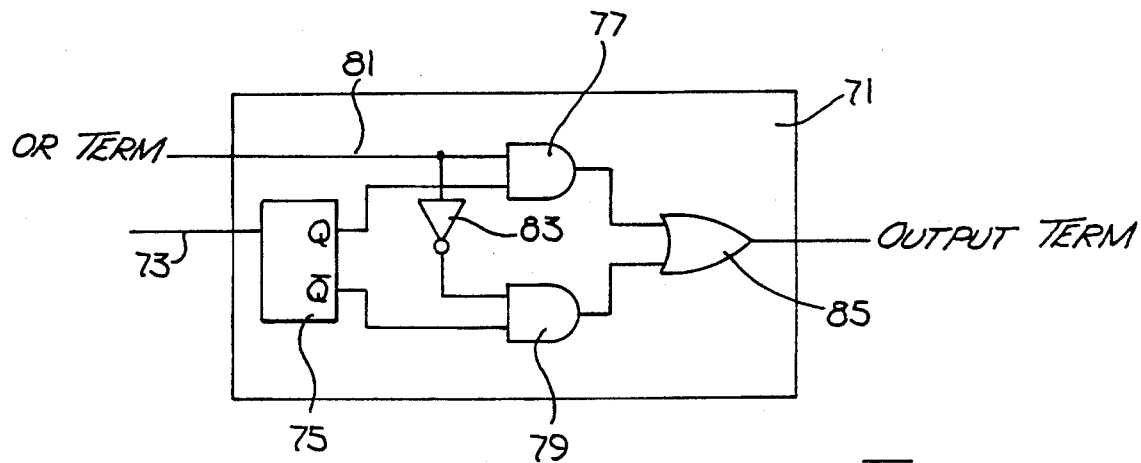
FIG. 6 is a logic level diagram showing a single programmable bit of an output term.

Each of the OR terms are then input to output polarity select plane 21 which comprises N programmable bits 71 as shown in FIG. 6. Each of the programmable bits is preprogrammed such that its output is either the inputted OR term or the inputted OR term inverted. In particular, by programming programmable bits 71 by placing a "1" on line 73 which is input to flip flop 75 the Q output is set to "1" and input to AND gate 77 and the $\bar{Q}$ output is set to "0" and input to AND gate 79. Now, if the input OR term is a "1" on line 81, the output of AND gate 77 will be "1" and the output of AND gate 79 will be "0." Since a "1" input and a "0" are input to OR gate 85, the output term will be "1" or the same as the input term. Similarly, if a "0" is placed on line 81, then one input to each of AND gates 77 and 79 will be "0," the two inputs to OR gate 85 will be "0" and the output will therefore be a "0" or the same as the inputted OR term on line 81.

However, if flip flop 75 is reset by a "0" on line 73, the $\bar{Q}$ output into AND gate 79 will be a "1" and the Q output into AND gate 77 will be a "0." In this manner, whatever is input on line 81 will be inverted by inverter 83 and output from AND gate 79 which, when combined with the "0" output from AND gate 77 will result in OR gate 85 outputting the inverse of whatever is input on line 81.

Referring back to FIG. 1, depending upon the manner in which the output polarity select plane 21 was programmed, each of the N OR terms output from OR plane 17 will be output from the output polarity select plane 21 as input or as the input inverted. Output latch and register 23 according to a signal on line 85 generated by decoder 39 will then latch each of the N OR terms and retain the same until needed by the circuit in which the SPLA is implemented or replaced by a subsequent set of outputs.

An example of a particular implementation of an SPTA as disclosed herein is set forth in copending patent application Ser. No. 723,739 filed Apr. 16, 1985, now U.S. Pat. No. 4,674,087 covering a very large scale integration incircuit emulator. However, the disclosed invention may be utilized whenever a PLA having a high degree of programmability is required.

It should be recognized that an SPLA as disclosed herein can be implemented having only one of an AND plane, OR plane, or output polarity select plane as well as any combination of such three planes. Similarly, the AND terms and OR terms can be implemented as NAND terms and/or NOR terms without departing from the spirit and scope of the invention as disclosed and claimed. Additionally, the programmable bits used in the AND plane, OR plane and output polarity select plane can be implemented using other combinations of flip flops, gates, inverters and other components than those which are set forth herein.

I claim:

1. A software programmable logic array comprising a first plurality of programmable bit means, each having a single data input and two and only two programming inputs for selectively generating an output which is dynamically programmable by the application of logic level signals to said two and only two programming inputs wherein the outputs of each said programmable bit means are ANDed together to produce a single AND term, said selectable output of each of said programmable bit means being determined by the values of said two and only two programming input to said programmable bit means, wherein said two and only two programming inputs for each of said plurality of programmable bit means are programmed in parallel, and wherein said data inputs for each of said plurality of programmable bit means receive input in parallel, and wherein each of said first plurality of programmable bit means includes:

first and second flip-flops, each having a Q output, whose inputs are coupled to said two and only two programming inputs;

first and second AND gates, each having as one input, a respective one of said Q outputs, a second input of said first AND gate being said single data input and a second input of said second AND gate being said single data input inverted; and an OR gate whose first and second inputs are the outputs of said first and second AND gates.

2. The software programmable logic array defined by claim 1 wherein said two programming inputs to each of said first plurality of programmable bit means is input into at least a second plurality of said programmable bit means and the output of each of said at least second plurality of programmable bit means are ANDed together to form at least a second AND term.

3. A software programmable logic array comprising a plurality of programmable bit means, each having a single data input and two and only two programming inputs for selectively generating an output which is dynamically programmable by the application of logic level input signals to said two and only two programming inputs, said selectable output of each of said programmable bits means being determined by the value of said two and only two programming inputs to said programmable bit means, and wherein said two and only two programming inputs for each of said plurality of programmable bit means are programmed in parallel, and wherein said data inputs for each of said plurality of programmable bit means receive input in parallel, wherein each of said programmable bit means includes:

a flip-flop whose Q output is input to a first AND gate and whose $\bar{Q}$ output is input to a second AND gate, and wherein a second input of said first AND gate is said single data input, and a second input of said second AND gate is said single data input inverted, and wherein said outputs of said first and second AND gates are input to an OR gate, the output of said OR gate being the output of said programmable bit means.

4. A software programmable logic array comprising:

AND plane means for receiving a plurality of inputs, said AND plane means including at least one set of first programmable bit means, each having a first single data input and two and only two programming inputs, and each of which produces a predetermined and dynamically programmable output by the application of logic level signals to said two and only two programming inputs, wherein the outputs of each set of said first programmable bit means are ANDed together to output at least one AND term; and OR plane means coupled to said AND plane means such that said at least one AND term output of said AND plane means is input to said OR place means, said OR plane means including at least one set of second programmable bit means, each having a second single data input and one and only one programming input and each of which produces a predetermined and dynamically programmable output, wherein the output of each set of said programmable bit means are ORed together to output at least one OR term, and wherein said one and only one programming input for each of said plurality of programmable bit means are programmed in parallel, and wherein said data inputs for each of said plurality of programmable bit means receive input in parallel, and wherein each of said programmable bit means includes:

a first flip-flop whose Q output is input to a first AND gate, a second flip-flop whose output is input to a second AND gate, wherein a second input of said first AND gate is a said first single data input, and a second input of said second AND is said first single data input inverted, and wherein the outputs of said two AND gates are input to an OR gate whose output is the output of each of said programmable bit means of said AND plane, and wherein each of said programmable bit means of said OR plane comprises a flip-flop whose Q output is input to an AND gate, the second input of said AND gate being said single data input, wherein the output of said AND gate is the output of each of said programmable bit means of said OR plane means.

5. The software programmable logic array defined by claim 4 further comprising an output polarity select plane means coupled to said OR plane means such that said at least one OR term output of said OR plane means is input to said output polarity select plane means, said output polarity select plane means including a set of programmable bit means, each having a third single data input and at least one programming input and each of which produces a predetermined and dynamically programmable output by the application of logic level signals to said at least one programming input, said output being one of equal in value to its input and inverse in value of its input, and wherein each of said programmable bit means of said output polarity select plane means includes:

a flip flop whose Q output is input to a first AND gate and whose Q̄ output is input to a second AND gate, and wherein a second input of said first AND gate is said third single data input, and a second input of said second AND gate is said third single data input inverted, and wherein said outputs of said two AND gates are input to an OR gate the output of which is the output of each of said programmable bit means of said output polarity select plane means.

6. The software programmable logic array defined in claim 4 wherein each of said first programmable bit means of said AND plane means is for selectively generating an output which is dynamically programmable by the application of logic level signals to said two programming inputs, wherein the outputs of each of said first programmable bit means of said AND plane means are ANDed together to produce a single AND term, said selectable output of each of said first programmable bits means being determined by the value of said programming inputs to said first programmable bit means.

7. The software programmable logic array defined by claim 4 wherein each of said second programmable bit means of said OR plane means is for selectively generating an output which is dynamically programmable by the application of logic level signals to said two programming inputs, wherein the outputs of said each of said second programmable bit means of said OR plane means are ORed together to produce a single OR term.

* * * * *